US010763087B2

(12) United States Patent
Takahashi et al.

(10) Patent No.: US 10,763,087 B2
(45) Date of Patent: Sep. 1, 2020

(54) PLASMA PROCESSING APPARATUS (71) Applicant: TOKYO ELECTRON LIMITED, Tokyo (JP)

(72) Inventors: Shuichi Takahashi, Miyagi (JP); Takaharu Miyadate, Miyagi (JP); Norinao Takasu, Miyagi (JP); Etsuji Ito, Miyagi (JP); Akihiro Yokota, Miyagi (JP); Naohiko Okunishi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 156 days.

(21) Appl. No.: 16/140,948

(22) Filed: Sep. 25, 2018

(65) Prior Publication Data
US 2019/0096639 A1 Mar. 28, 2019

(30) Foreign Application Priority Data
Sep. 26, 2017 (JP) .................. 2017-185071

(51) Int. Cl.
H01J 37/32 (2006.01)
H01L 21/67 (2006.01)
H01L 21/311 (2006.01)
H01L 29/66 (2006.01)

(52) U.S. Cl.
CPC .. *H01J 37/32669* (2013.01); *H01J 37/32091* (2013.01); *H01J 37/32715* (2013.01); *H01L 21/67069* (2013.01); *H01J 2237/002* (2013.01); *H01J 2237/152* (2013.01); *H01J 2237/327* (2013.01); *H01J 2237/3341* (2013.01); *H01L 21/31116* (2013.01); *H01L 21/31144* (2013.01); *H01L 21/67109* (2013.01); *H01L 29/66795* (2013.01)

(58) Field of Classification Search
CPC .......... H01J 37/32715; H01J 37/32091; H01J 37/32669; H01J 2237/002; H01J 2237/152; H01J 2237/3341; H01J 2237/327; H01L 21/67069; H01L 21/67109; H01L 21/31116; H01L 29/66795; H01L 21/31144
See application file for complete search history.

(56) References Cited

U.S. PATENT DOCUMENTS
2006/0037701 A1 2/2006 Koshiishi et al.

FOREIGN PATENT DOCUMENTS
JP 2006-270017 A 10/2006

*Primary Examiner* — Yuechuan Yu
(74) *Attorney, Agent, or Firm* — Rothwell, Figg, Ernst & Manbeck, P.C.

(57) ABSTRACT

A plasma processing apparatus includes a stage including a lower electrode in an inner space of a chamber main body. An upper electrode is provided above the stage. A first radio frequency power supply is electrically connected to the upper electrode through a power feed conductor. A second radio frequency power supply is electrically connected to a lower electrode. A ground conductor extends above the chamber main body to cover the upper electrode. The ground conductor provides an external space at the outside thereof on the side of the inner space. the third portion, the external space being provided on the second portion and above the inner space. The external space is spaced upward from the upper electrode and is shielded from the upper electrode by the ground conductor. An electromagnet is disposed in the external space.

10 Claims, 10 Drawing Sheets

PLASMA PROCESSING APPARATUS

CROSS-REFERENCE TO RELATED APPLICATIONS

This application claims priority to Japanese Patent Application No. 2017-185071, filed on Sep. 26, 2017, the entire contents of which are incorporated herein by reference.

FIELD OF THE INVENTION

The present disclosure relates to a plasma processing apparatus.

BACKGROUND OF THE INVENTION

In a semiconductor device manufacturing process, a plasma processing apparatus is used for processing a target object. A capacitively coupled plasma processing apparatus is known as an example of the plasma processing apparatus. The capacitively coupled plasma processing apparatus includes a chamber main body, a stage, an upper electrode, a first radio frequency power supply, and a second radio frequency power supply.

The chamber main body provides an inner space and is grounded. The stage is provided in the inner space of the chamber main body. The stage is configured to support a target object mounted thereon. The target object is mounted on the stage to be positioned on the central axis of the chamber main body. The stage includes a lower electrode. The upper electrode is provided above the stage. The first radio frequency power supply mainly supplies first radio frequency waves for plasma generation. The first radio frequency power supply is electrically connected to the lower electrode or the upper electrode. The second radio frequency power supply mainly supplies second radio frequency waves for attracting ions to the target object. A frequency of the second radio frequency waves is lower than that of the first radio frequency waves. The second radio frequency power supply is electrically connected to the lower electrode.

When the first radio frequency power supply is connected to the upper electrode, a ground conductor covers the upper electrode. The ground conductor has a cylindrical shape. A space surrounded by the ground conductor is provided above the upper electrode. The upper electrode and the first radio frequency power supply are connected through a power feed conductor. The power feed conductor extends from the upper electrode to the outside of the ground conductor while passing through the space surrounded by the ground conductor, and is connected to the first radio frequency power supply. The plasma processing apparatus is described in Japanese Patent Application Publication No. 2006-270017.

Electric field intensity distribution in which an electric field intensity is high above the center of the target object and low above the edge side of the target object is generated in the inner space of the plasma processing apparatus. In other words, the non-uniform electric field intensity distribution in which the electric field intensity is decreased as a distance from the central axis in a radial direction is increased is generated in the inner space. This tendency is remarkable when the frequency of the second radio frequency waves is high. Under such electric field intensity distribution, the plasma density is high near the central axis and low at a position far from the central axis. In other words, the plasma density is non-uniformly distributed in a radial direction with respect to the central axis.

In order to obtain uniform distribution of the plasma density under the above-described electric field intensity, it is considered to generate distribution of a magnetic field having a small horizontal component near the central axis and a large horizontal component at a position far from the central axis in the inner space of the chamber main body. Such magnetic field distribution can be generated by providing an electromagnet on the upper electrode. However, when the electromagnet is disposed in the space surrounded by the ground conductor, the first radio frequency waves flow into the electromagnet and/or a wiring connecting the electromagnet and a power supply. Accordingly, the electric field intensity in the inner space of the chamber main body varies locally. Therefore, it is required to uniform the distribution of the plasma density by the electromagnet arranged outside the ground conductor.

SUMMARY OF THE INVENTION

In accordance with an aspect, there is provided a plasma processing apparatus including: a chamber main body; a gas supply unit configured to supply a gas to an inner space provided by the chamber main body; a stage configured to provide a mounting region for a target object provided in the inner space, a center of the mounting region being positioned on a central axis of the chamber main body; a lower electrode provided in the stage; an upper electrode provided above the stage with the inner space interposed therebetween; a power feed conductor connected to the upper electrode, the power feed conductor extending upward from the upper electrode; a first radio frequency power supply configured to supply first radio frequency waves and electrically connected to the upper electrode through the power feed conductor; a second radio frequency power supply configured to supply second radio frequency waves having a frequency lower than a frequency of the first radio frequency waves and electrically connected to the lower electrode; an electromagnet provided above the upper electrode and configured to generate distribution of a magnetic field having a horizontal component, greater than a horizontal component on the central axis, at a position far from the central axis in the inner space; and a ground conductor grounded and extending above the chamber main body to cover the upper electrode. The ground conductor includes a cylindrical first portion extending upward from the chamber main body; a second portion spaced upwardly from the upper electrode, the second portion extending from the first portion toward the central axis to provide a first space on the upper electrode together with the first portion; a cylindrical third portion positioned closer to the central axis compared to the first portion, the third portion extending upward from the second portion to provide a second space communicating with the first space. The power feed conductor extends upward through the first space and the second space, and the electromagnet is disposed in an external space provided by the ground conductor at the outside of the third portion, the external space being provided on the second portion and above the inner space.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Hereinafter, embodiments will be described in detail with reference to the accompanying drawings. Like reference numerals will be given to like or corresponding parts throughout the drawings.

Figure 1:
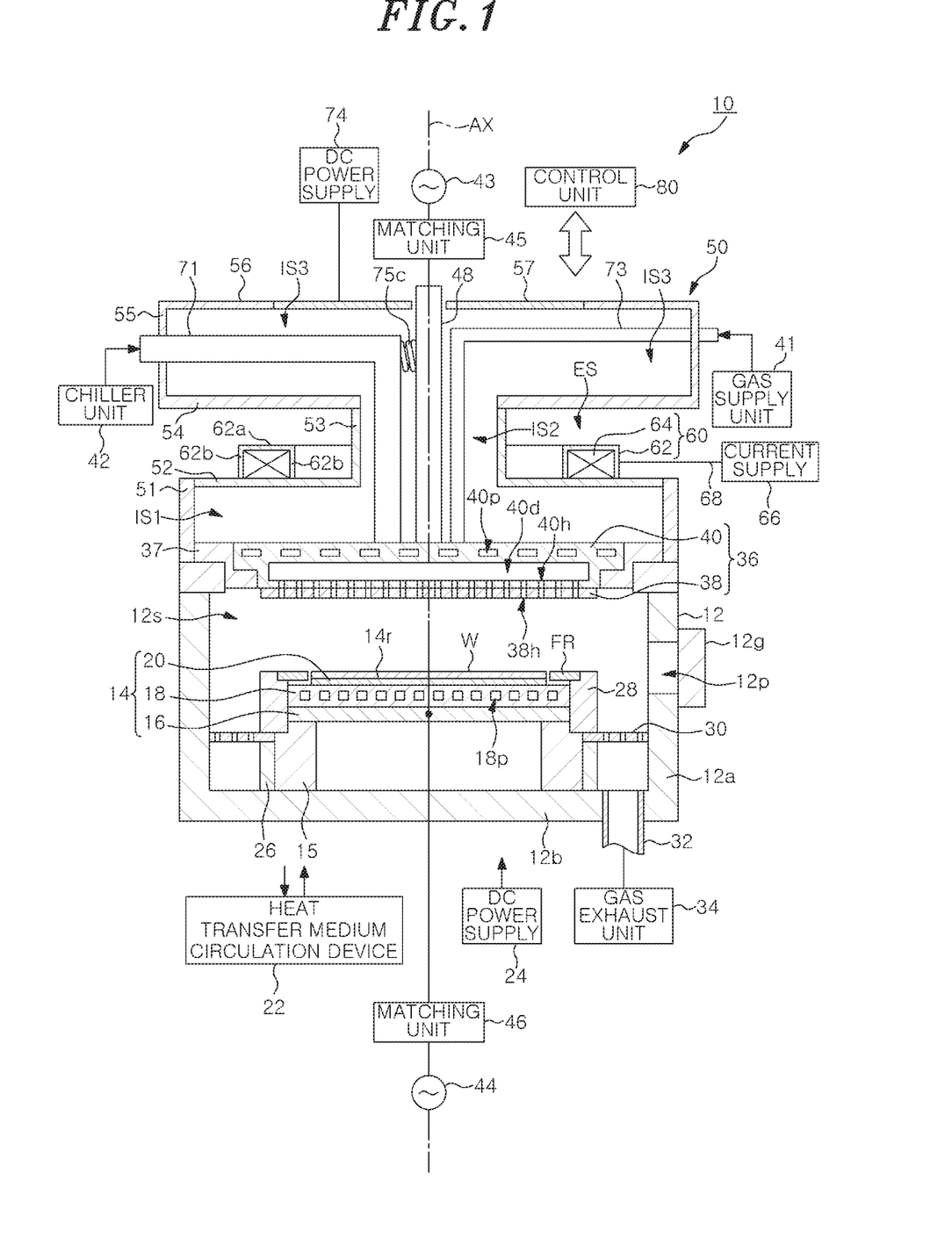
FIG. 1 schematically shows a plasma processing apparatus according to an embodiment.

FIG. 1 schematically shows a plasma processing apparatus according to an embodiment. FIG. 1 shows a state in which the plasma processing apparatus according to an embodiment is partially broken along a plane extending in a vertical direction. The plasma processing apparatus 10 shown in FIG. 1 includes a chamber main body 12. The chamber main body 12 has a cylindrical shape and has a sidewall 12a and a bottom portion 12b. The chamber main body 12 provides an inner space 12s. A central axis line AX shown in FIG. 1 is the central axis line of the chamber main body 12 and the inner space 12s. The chamber main body 12 is made of a metal, e.g., aluminum. A plasma resistant film is formed on an inner wall surface of the chamber main body 12. This film may be a ceramic film such as an alumite film, or a film made of yttrium oxide. The chamber main body 12 is grounded.

A passage 12p is formed at the sidewall 12a. The target object W is transferred between the inner space 12s and the outside of the chamber main body 12 through the passage 12p. The target object W may have a disc shape as a wafer. The passage 12p can be opened and closed by a gate valve 12g. The gate valve 12g is provided along the sidewall 12a.

A stage 14 is provided in the inner space 12s. The stage 14 is supported by a support 15. The support 15 has a cylindrical shape and extends upward from the bottom portion 12b of the chamber main body 12. The support 15 has an insulating property, and is made of, e.g., ceramic.

The stage 14 is configured to support the target object W. The stage 14 shares the central axis AX with the chamber main body 12. The stage 14 provides a mounting region 14r. The center of the mounting region 14r is positioned on the central axis AX. The target object W is mounted on the mounting region 14r such that the center thereof is positioned on the central axis AX.

The stage 14 includes an electrode plate 16, a lower electrode 18, and an electrostatic chuck 20. The electrode plate 16 has a substantially disc shape. The electrode plate 16 has conductivity. The electrode plate 16 is made of a metal such as aluminum. The lower electrode 18 is mounted on the electrode plate 16. The lower electrode 18 is electrically connected to the electrode plate 16.

A flow path 18p is formed in the lower electrode 18. The flow path 18p extends in, e.g., a spiral shape, in the lower electrode 18. A heat exchange medium (e.g., coolant) from a heat transfer medium circulation device 22 (e.g., chiller unit) is supplied to the flow path 18p. The circulation device 22 is provided outside the chamber main body 12. The heat transfer medium supplied to the flow path 18p returns to the circulation device 22. A temperature of the target object W mounted on the stage 14 is controlled by heat exchange between the heat exchange medium and the lower electrode 18.

The electrostatic chuck 20 is provided on the lower electrode 18. The electrostatic chuck 20 has a substantially disc shape. The electrostatic chuck 20 has a structure in which a film-shaped electrode is embedded in a main body made of ceramic. A DC power supply 24 is connected to the electrode of the electrostatic chuck 20 via a switch. The electrostatic chuck 20 provides the above-described mounting region 14r. When a DC voltage from the DC power supply 24 is applied to the electrode of the electrostatic chuck 20 in a state where the target object W is mounted on the electrostatic chuck 20 (on the mounting region 14r), an electrostatic attraction force is generated between the target object W and the electrostatic chuck 20. Due to the generated electrostatic attraction force, the target object W is attracted to and held on the electrostatic chuck 20. The plasma processing apparatus 10 may be provided with a heat transfer gas supply line for supplying a heat transfer gas (e.g., He gas) to a gap between the electrostatic chuck 20 and a lower surface of the target object W.

One or more heaters (e.g., one or more resistance heating elements) may be provided in the electrostatic chuck 20. By supplying power from a heater controller to the one or more heaters, the heaters generate heat. Accordingly, a temperature of the electrostatic chuck 20 and, further, a temperature of the target object W, are controlled.

In the inner space 12s of the chamber main body 12, the focus ring FR is disposed to surround the edge of the electrostatic chuck 20 and the edge of the target object W. The focus ring FR is an annular plate made of a silicon-containing material such as silicon, quartz or the like. The focus ring FR is used to obtain uniformity of plasma processing.

A cylindrical conductor 26 is provided around the support 15. The conductor 26 is grounded. A cylindrical insulator 28 is provided above the conductor 26 to surround the stage 14. The insulator 28 is made of ceramic such as quartz or the like. A gas exhaust passageway is formed between the stage 14 and the sidewall 12a of the chamber main body 12. A baffle plate 30 is provided in the gas exhaust passageway. The baffle plate 30 is an annular plate. A plurality of holes is formed through the baffle plate 30 in a plate thickness direction thereof. The baffle plate 30 is formed by forming a plasma resistant film such as yttrium oxide or the like on a surface of a base material made of a metal such as aluminum or the like.

Below the baffle plate 30, a gas exhaust line 32 is connected to the bottom portion 12b of the chamber main body 12. The gas exhaust line 32 can communicate with the gas exhaust passageway. A gas exhaust unit 34 is connected to the gas exhaust line 32. The gas exhaust unit 34 includes a vacuum pump such as an automatic pressure control valve and a turbo molecular pump. By operating the gas exhaust unit 34, a pressure in the inner space 12s is set to a predetermined level.

An upper electrode 36 is provided above the stage 14. A part of the inner space 12s is interposed between the upper electrode 36 and the stage 14. The upper electrode 36 is provided to block an upper opening of the chamber main body 12. A member 37 is interposed between the upper electrode 36 and an upper end portion of the chamber main body 12. The member 37 is made of an insulating material. The member 37 may be made of ceramic, e.g., quartz. In one embodiment, the member 37 and a part of a ground conductor to be described later may be interposed between the upper electrode 36 and the upper end portion of the chamber main body 12.

In one embodiment, the upper electrode 36 constitutes a shower head. In one embodiment, the upper electrode 36 includes a ceiling plate 38 and a holder 40. The ceiling plate 38 is made of, e.g., silicon. Alternatively, the ceiling plate 38 may be formed by coating ceramic such as yttrium oxide or the like on a surface of a base material made of aluminum. A plurality of gas injection holes 38h is formed through the ceiling plate 38 in a thickness direction thereof.

The holder 40 is provided on the ceiling plate 38. The holder 40 is configured to detachably hold the ceiling plate 38. The holder 40 is made of a conductive material such as aluminum or the like. A gas diffusion space 40d is formed in the holder 40. A plurality of holes 40h extending downward from the gas diffusion space 40d is formed in the holder 40. The plurality of holes 40h communicates with the respective gas injection holes 38h.

A gas supply unit 41 is connected to the gas diffusion space 40d. The gas supply unit 41 is configured to supply a gas to the inner space 12s. In one embodiment, the gas supply unit 41 is configured to output a first gas and a second gas. The first gas and the second gas will be described later. The gas supply unit 41 includes one or more flow rate controllers and one or more valves. Further, the gas supply unit 41 is configured to separately control flow rates of the gases to be outputted. The gases outputted from the gas supply unit 41 are injected into the inner space 12s from the gas injection holes 38h through the gas diffusion space 40d and the holes 40h.

A flow path 40p is formed in the holder 40. A chiller unit 42 is connected to the flow path 40p. A coolant such as cooling water is circulated between the flow path 40p and the chiller unit 42. A temperature of the upper electrode 36 is adjusted by heat exchange between the coolant supplied from the chiller unit 42 to the flow path 40p and the upper electrode 36.

The plasma processing apparatus 10 further includes a first radio frequency power supply 43 and a second radio frequency power supply 44. The first radio frequency power supply 43 and the second radio frequency power supply 44 are provided outside the chamber main body 12. The first radio frequency power supply 43 is configured to mainly supply first radio frequency waves for generating plasma. The first radio frequency waves may have a frequency of, e.g., 100 MHz, but not limited thereto. The first radio frequency power supply 43 is electrically connected to the upper electrode 36 via a matching unit 45 and a power feed conductor 48. The matching unit 45 has a matching circuit for matching an output impedance of the first radio frequency power supply 43 and an impedance of a load side (the upper electrode 36 side). A lower end of the power feed conductor 48 is connected to the upper electrode 36. The power feed conductor 48 extends upward from the upper electrode 36. The power feed conductor 48 is a cylindrical or rod-shaped conductor. A central axis of the power feed conductor 48 substantially coincides with the central axis AX.

The second radio frequency power supply 44 is configured to mainly supply second radio frequency waves, i.e., a radio frequency bias power, for attracting ions to the target object W. A frequency of the second radio frequency waves is lower than that of the first radio frequency waves. In one embodiment, the frequency of the second radio frequency waves is higher than 13.56 MH. In one embodiment, the frequency of the second radio frequency waves may be greater than or equal to 40 MHz. In one embodiment, the frequency of the second radio frequency waves may be greater than or equal to 60 MHz. The second radio frequency power supply 44 is electrically connected to the lower electrode 18 via a matching unit 46. The matching unit 46 has a matching circuit for matching an output impedance of the second radio frequency power supply 44 and an impedance of a load side (the lower electrode 18 side).

The plasma processing apparatus 10 further includes a ground conductor 50. The ground conductor 50 has conductivity. The ground conductor 50 is made of a metal such as aluminum. The ground conductor 50 is grounded. The ground conductor 50 extends to cover the upper electrode 36 above the chamber main body 12. The power feed conductor 48 extends upward to the outside of the ground conductor 50 through a space surrounded by the ground conductor 50 and is connected to the first radio frequency power supply 43 via a matching unit 45 outside the ground conductor 50.

Figure 2:
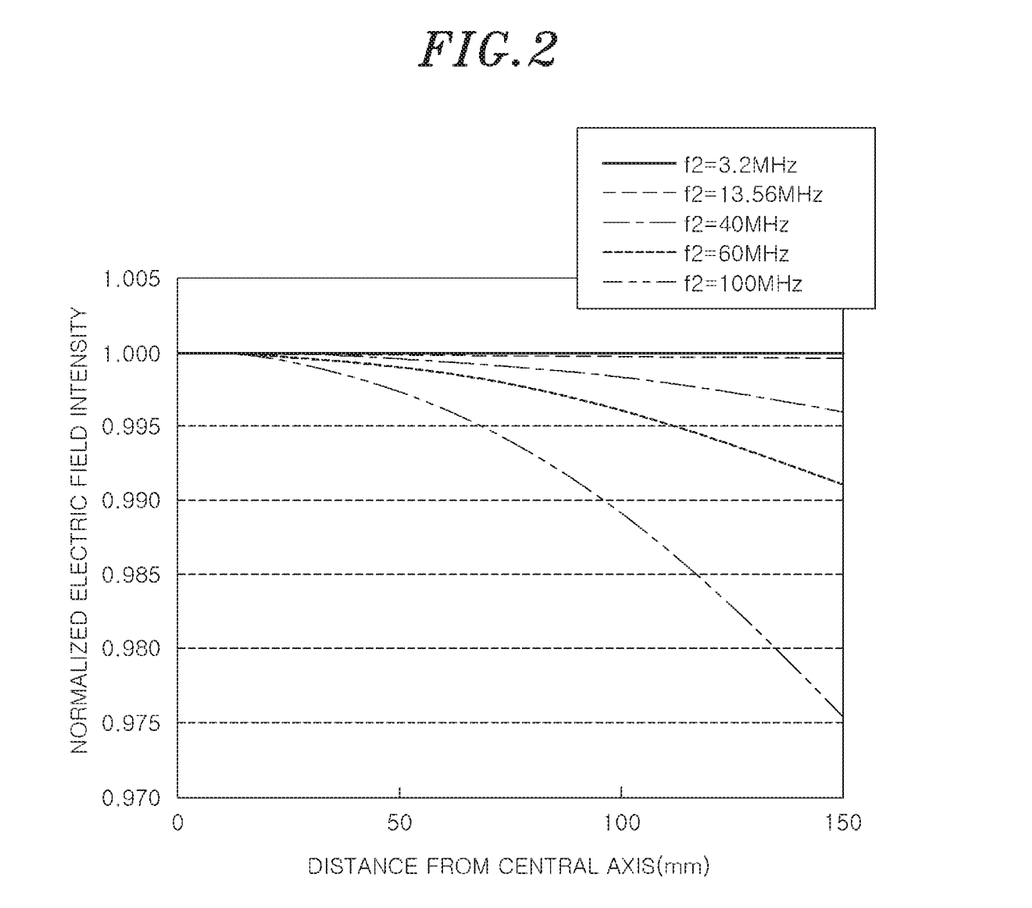
FIG. 2 is a graph showing a calculation result of distribution of an electric field intensity in an inner space of a chamber main body.

The electric field intensity distribution in which the electric field intensity is high on the center of the target object W and low on the edge of the target object W is generated in the inner space 12s of the chamber main body 12 of the plasma processing apparatus 10. In other words, the non-uniform electric field intensity distribution in which the electric field intensity is decreased as a distance from the central axis AX in a radiation direction (i.e., diametrical direction) is increased is generated in the inner space 12s. FIG. 2 is a graph showing a calculation result of the electric field intensity distribution in the inner space of the chamber main body. In FIG. 2, the horizontal axis represents a distance from the central axis AX in the radial direction, and the vertical axis represents a normalized electric field intensity. FIG. 2 shows the distribution of the normalized electric field intensity in the case of using a plurality of frequencies f2 of the second radio frequency waves. As shown in FIG. 2, the non-uniformity of the electric field intensity in the radial direction becomes more evident as the frequency f2 of the second radio frequency waves becomes higher. When the frequency f2 of the second radio frequency waves is set to a high level, the energy of ions irradiated onto the target object W is decreased.

Under the above-described non-uniform electric field intensity distribution, the plasma density is high near the central axis and low at a position far from the central axis. In other words, the plasma density distribution is non-uniform in the radial direction with respect to the central axis. The plasma processing apparatus 10 further includes an electromagnet 60 in order to obtain uniform plasma density distribution even in the process in which the above-described non-uniform electric field intensity distribution is generated, e.g., the process using the second radio frequency waves having a radio frequency.

As shown in FIG. 1, the electromagnet 60 is disposed above the upper electrode 36. The electromagnet 60 generates distribution of magnetic field having a horizontal component greater than a horizontal component on the central axis AX at a position far from the central axis AX in the inner space 12s of the chamber main body 12. In other words, the electromagnet 60 generates in the inner space 12s the distribution of the magnetic field having a horizontal component whose magnitude is increased as a distance in the radial direction from the central axis AX is increased. At a position where the magnetic field having a large horizontal component is generated, electrons stay for a long period of time. Therefore, the plasma density becomes higher at the position where the magnetic field having a large horizontal component is generated. Accordingly, in accordance with the plasma processing apparatus 10, it is possible to obtain plasma density distribution that is uniform in the radial direction with respect to the central axis AX. As a result, in accordance with the plasma processing apparatus 10, the in-plane uniformity of the processing on the target object W is improved.

In one embodiment, the electromagnet 60 includes a yoke 62 and a coil 64. The yoke 62 is made of a magnetic material. The yoke 62 has a base portion 62a and a plurality of cylindrical portions 62b. The base portion 62a has a substantially disc shape and extends in a direction orthogonal to the central axis AX. Each of the cylindrical portions 62b has a cylindrical shape and extends downward from the base portion 62a. The cylindrical portions 62b are provided coaxially about the central axis AX. The coil 64 is wound around the central axis AX. The coil 64 is provided between two cylindrical portions 62b adjacent to each other in the radial direction. The electromagnet 60 may have one or more coils 64. When the electromagnet 60 includes a plurality of coils 64, the plurality of coils 64 is provided coaxially about the central axis AX.

The coil 64 of the electromagnet 60 is connected to a current supply 66 through a wiring 68. When a current from the current supply 66 is applied to the coil 64, a magnetic field is generated by the electromagnet 60. At a position where an angle of a vector of the magnetic field generated by the electromagnet 60 is 45°, it is possible to satisfy both of an electron confinement effect (effect of suppressing diffusion of electrons) in the radiation direction (diametrical direction) and an effect of suppressing extinction of electrons (effect of preventing electrons from reaching the electrode). Therefore, the plasma density becomes high at that position. Accordingly, when the target object W has a radius of 150 mm, the electromagnet 60 may be arranged such that a distance between the position where the angle of the vector of the magnetic field is 45° and the central axis AX becomes greater than or equal to 135 mm and smaller than or equal to 185 mm. Therefore, in one embodiment, an average value of an inner diameter and an outer diameter of one coil 64 of the electromagnet 60 is equal to or greater than a distance between the central axis AX and the edge of the target object W. When a radius of the target object W is 150 mm, the average value of the inner diameter and the outer diameter of one coil 64 of the electromagnet 60 is greater than or equal to 150 mm and smaller than or equal to 250 mm. The angle of the vector of the magnetic field is 0° when the magnetic field only has a downward component and 90° when the magnetic field only has a radial component (horizontal component). Accordingly, when the angle of the vector of the magnetic field is 45°, the magnetic field has both of the horizontal component and the vertical component.

When the electromagnet 60 is disposed in the space surrounded by the ground conductor covering the upper electrode, the first radio frequency waves flow into the electromagnet 60 and/or the wiring connecting the electromagnet 60 and the power supply (current supply). As a consequence, the electric field intensity in the inner space 12s of the chamber main body 12 varies locally. Therefore, the electromagnet 60 is arranged outside the ground conductor. However, when the electromagnet 60 is disposed in a space above the upper end of the ground conductor, a vertical distance from the electromagnet 60 to the inner space 12s is increased and, thus, it is difficult to efficiently generate a magnetic field having a sufficient magnitude in the inner space 12s unless a large current is applied to the coil 64. When the electromagnet 60 is disposed at a side of the ground conductor (outside the ground conductor in the radial direction with respect to the central axis), a position where a magnetic field having a large horizontal component or a position where a magnetic field whose vector has an angle of 45° is generated is not generated in the inner space 12s. In order to efficiently generate magnetic field distribution suitable for obtaining uniform plasma density distribution in the inner space 12s, the ground conductor 50 provides an external space ES in which the electromagnet 60 is arranged. The external space ES is closer to the inner space 12s, compared to the upper end of the ground conductor 50, and spaced upward from the upper electrode 36. Further, the external space ES is shielded from the upper electrode 36 by the ground conductor 50.

The ground conductor 50 includes a first portion 51, a second portion 52, and a third portion 53. The first portion 51 has a cylindrical shape. A central axis of the first portion 51 substantially coincides with the central axis AX. The first portion 51 extends upward from the chamber main body 12. In the example shown in FIG. 1, the first portion 51 extends upward from the upper end of the sidewall 12a of the chamber main body 12. The lower end portion of the first portion 51 is interposed between the member 37 and the upper end of the side wall 12a.

The second portion 52 is spaced upward from the upper electrode 36 and extends from the first portion 51 toward the central axis AX. The second portion 52 has a plate shape extending in a direction intersecting with or orthogonal to the central axis AX. The first portion 51 and the second portion 52 provide a first space IS1 on the upper electrode 36. The first space IS1 is a part of the inner space of the ground conductor 50 (on the side of the upper electrode 36). Due to the first space IS1, a vertical distance between the upper electrode 36 and the ground conductor 50 is ensured. Therefore, capacitive coupling between the ground conductor 50 and the upper electrode 36 is suppressed. The vertical distance between the upper surface of the upper electrode 36 and the lower surface of the second portion 52 of the ground conductor 50 is set to, e.g., 60 mm or more.

The third portion 53 has a cylindrical shape. A central axis of the third portion 53 substantially coincides with the central axis AX. The third portion 53 extends at a position closer to the central axis, compared to the first portion 51. The third portion 53 extends upward from the second portion 52. The third portion 53 provides a second space IS2. The second space IS2 is an inner space of the second portion 52 and is a part of the inner space of the ground conductor 50 (on the side of the upper electrode 36). The second space IS2 communicates with the first space IS1. Further, the power feed conductor 48 extends upward through the first space IS1 and the second space IS2.

The external space ES is provided by the ground conductor 50 at the outside of the third portion 53. The external space ES is provided on the second portion 52 and above the inner space 12s. The external space ES extends on the second portion 52 and at the outside of the third portion 53 in the circumferential direction around the central axis AX. The electromagnet 60 is disposed in the external space ES. The vertical distance between the lower end of the electromagnet 60 arranged in the external space ES and the upper surface of the upper electrode 36 may be greater than 60 mm, and the vertical distance between the lower end of the electromagnet 60 and the target object W mounted on the stage 14 may be 230 mm or less.

The distance between the electromagnet 60 arranged in the external space ES and the inner space 12s is relatively short. As described above, the electromagnet 60 has a low horizontal component in the vicinity of the central axis AX and generates distribution of a magnetic field having a large horizontal component at a position far from the central axis in the inner space 12s. Therefore, magnetic field distribution suitable for obtaining uniform plasma density distribution can be efficiently generated in the inner space 12s by the electromagnet 60 arranged at the outside of the ground conductor 50.

The current supply 66 is connected to the coil 64 of the electromagnet 60 as described above. The electromagnet 60 and the current supply 66 are arranged at the outside of the ground conductor 50. Therefore, a filter for preventing inflow of the radio frequency power into the current supply 66 may not be provided between the coil 64 and the current supply 66.

In one embodiment, the ground conductor 50 further comprises a fourth portion 54, a fifth portion 55, and a sixth portion 56. The fourth portion 54 extends above the second portion 52 from the third portion 53 in a radial direction with respect to the central axis AX. The fourth portion 54 has a plate shape extending in a direction intersecting with or orthogonal to the central axis AX. The fifth portion 55 has a cylindrical shape. A central axis of the fifth portion 55 substantially coincides with the central axis AX. The fifth portion 55 is farther from the central axis, compared to the third portion 53, and extends upward from the fourth portion 54. The sixth portion 56 extends above the fourth portion 54 from the fifth portion 55 toward the central axis AX. The sixth portion 56 has a plate shape extending in a direction intersecting with or orthogonal to the central axis AX. In one embodiment, the ground conductor 50 further includes a cover 57 extending from the sixth portion to the vicinity of the power feed conductor 48.

The fourth portion 54, the fifth portion 55, and the sixth portion 56 provide a third space IS3. The third space IS3 is surrounded by the fourth portion 54, the fifth portion 55, and the sixth portion 56, and is a part of the inner space of the ground conductor 50. The third space IS3 communicates with the second space IS2. The power feed conductor 48 extends upward through the third space IS3. In the example shown in FIG. 1, the first to the sixth portion are formed of three members. However, the number of members forming the ground conductor 50 may vary.

Figure 3:
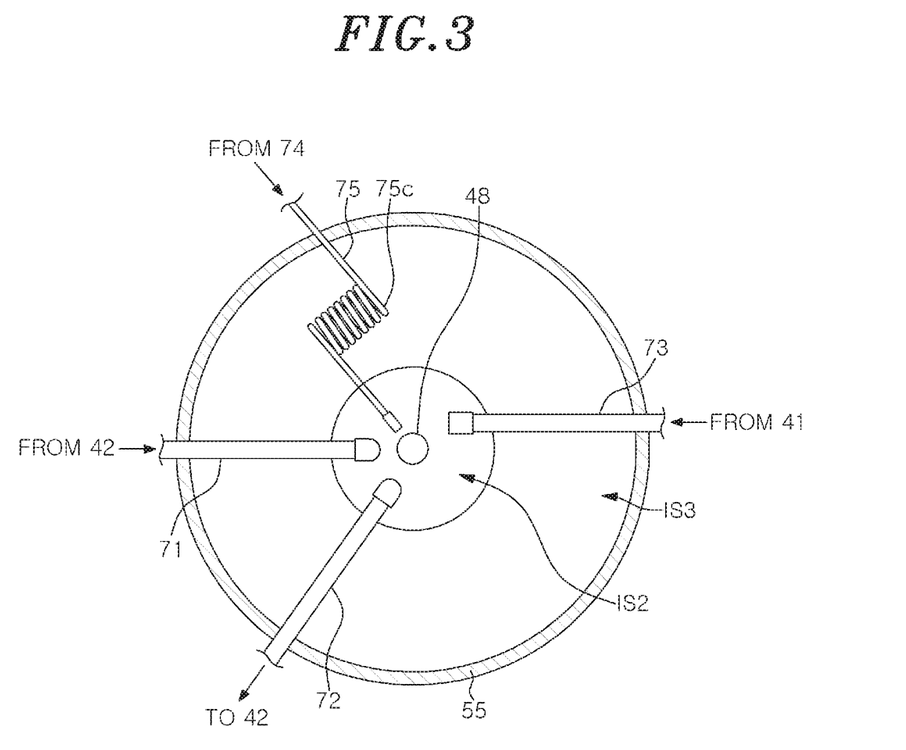
FIG. 3 is a plan view showing an internal configuration of a ground conductor of the plasma processing apparatus shown in FIG. 1.

Hereinafter, FIG. 3 will be referred to together with FIG. 1. FIG. 3 is a plan view showing an internal configuration of the ground conductor of the plasma processing apparatus shown in FIG. 1. FIG. 3 shows a state in which the fifth portion 55 of the ground conductor 50 is broken along a horizontal plane. In one embodiment, as shown in FIGS. 1 and 3, the plasma processing apparatus 10 further includes a pipe 71 (first pipe). The pipe 71 extends upward from the upper electrode 36 through the first space IS1 and the second space IS2 and extends laterally through the third space IS3 to the outside of the ground conductor 50. The pipe 71 is connected to the chiller unit 42 at the outside of the ground conductor 50. The coolant from the chiller unit 42 is supplied to the flow path 40p through the pipe 71. In the third space IS3, the pipe 71 is substantially shielded from the upper electrode 36 by the fourth portion 54 of the ground conductor 50.

The plasma processing apparatus 10 further includes a pipe 72. The pipe 72 extends upward through the first space IS1 and the second space IS2 and extends laterally through the third space IS3 to the outside of the ground conductor 50. The pipe 72 is connected to chiller unit 42 at the outside of ground conductor 50. The coolant is returned from the flow path 40p to the chiller unit 42 through the pipe 72. In the third space IS3, the pipe 72 is substantially shielded from the upper electrode 36 by the fourth portion 54 of the ground conductor 50.

In one embodiment, the plasma processing apparatus 10 further includes a pipe 73 (a second pipe). The pipe 73 extends upward from the upper electrode 36 through the first space IS1 and the second space IS2 and extends laterally through the third space IS3 to the outside of the ground conductor 50. The pipe 73 is connected to the gas supply unit 41 at the outside of the ground conductor 50. The gas outputted from the gas supply unit 41 is supplied to the upper electrode 36, i.e., the shower head, through the pipe 73. In the third space IS3, the pipe 73 is substantially shielded from the upper electrode 36 by the fourth portion 54 of the ground conductor 50. The gas supply unit 41 and the upper electrode 36 (i.e., the shower head) may be connected to each other through a plurality of pipes.

In one embodiment, the plasma processing apparatus 10 further includes a DC power supply 74 and a wiring 75. The DC power supply 74 is configured to generate a negative DC voltage to be applied to the upper electrode 36. The wiring 75 connects the DC power supply 74 and the upper electrode 36. The wiring 75 may include a coil 75c. The coil 75c is provided in the third space IS3. The wiring 75 extends upward from the upper electrode 36 through the first space IS1 and the second space IS2 and extends laterally through the third space IS3 to the outside of the ground conductor 50. The wiring 75 is electrically insulated from the fifth portion 55 and the ground conductor 50. The wiring 75 is connected to the DC power supply 74 at the outside of the ground conductor 50. In the third space IS3, the wiring 75 is substantially shielded from the upper electrode 36 by the fourth portion 54 of the ground conductor 50.

In one embodiment, the plasma processing apparatus 10 further includes a control unit 80. The control unit 80 is configured to control the respective components of the plasma processing apparatus 10. The control unit 80 may be a computer device. The control unit 80 may include a processor, a storage device such as a memory, an input device such as a keyboard, a mouse and a touch panel, a display device, an input/output interface of a control signal, and the like. The storage device stores a control program and a recipe data. The processor of the control unit 80 executes the control program and sends control signals to control the respective components of the plasma processing apparatus 10 based on the recipe data. In one embodiment, the control unit 80 can control the respective components of the plasma processing apparatus 10 to perform a plasma processing method (method MT) to be described later.

Figure 4:
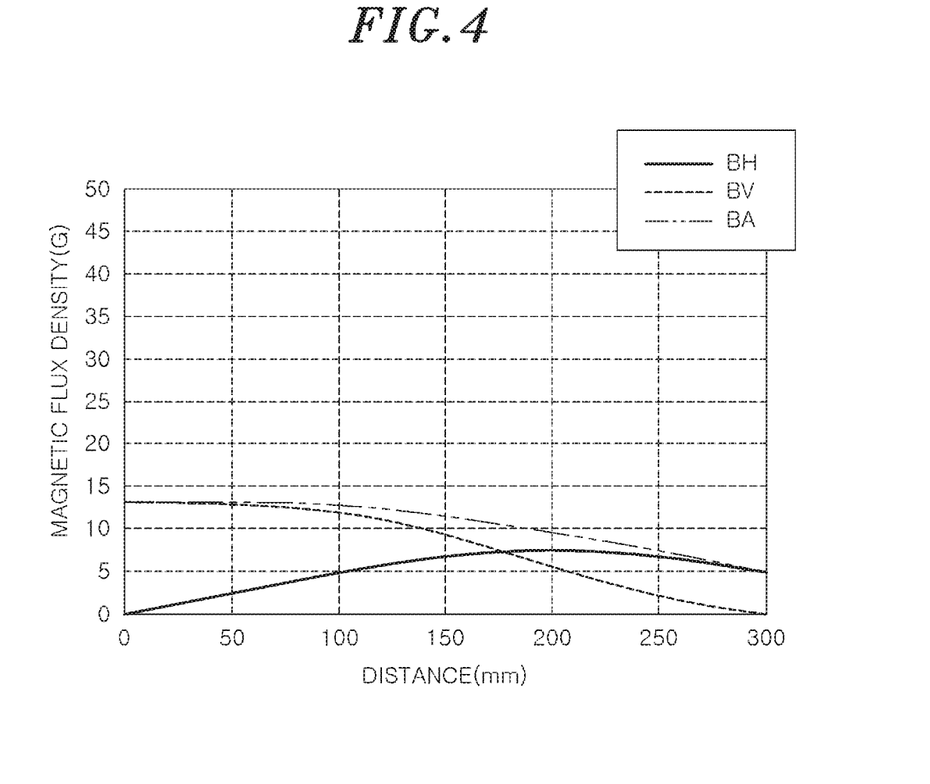
FIG. 4 shows a calculation result of distribution of a magnetic field that can be generated by the plasma processing apparatus shown in FIG. 1.

Hereinafter, FIG. 4 will be referred to. FIG. 4 is a graph showing a calculation result of distribution of a magnetic field that can be generated by the plasma processing apparatus shown in FIG. 4. In FIG. 4, the horizontal axis represents a distance from the central axis AX, and the vertical axis represents a magnetic flux density. FIG. 4 shows distribution of a magnetic flux density indicating distribution of a magnetic field BA, distribution of a magnetic flux density indicating distribution of a horizontal component BH of the magnetic field BA, and distribution of a magnetic flux density indicating distribution of a vertical component BV of the magnetic field BA. The distribution of the magnetic field and two components thereof shown in FIG. 4 corresponds to the distribution in the plane spaced downward from the lower end of the electromagnet 60 by 174 mm, i.e., the distribution on the upper surface of the stage 14. The distribution of the magnetic field and the two components thereof shown in FIG. 4 is calculated under the following conditions.

(Calculation Conditions)
Inner diameter (radius) of the coil 64: 132 mm
Outer diameter (radius) of coil 64: 173 mm
Number of turns of the coil 64: 215
Current supplied to the coil 64: 4 [A]
Distance between the lower end of the electromagnet 60 and the target object W mounted on the stage 14: 174 mm As can be seen from the calculation result of the magnetic field distribution shown in FIG. 4, it is possible to generate the distribution of the magnetic field having a horizontal component, greater than the horizontal component on the central axis AX, at a position far from the central axis AX by using the electromagnet 60.

Figure 5:
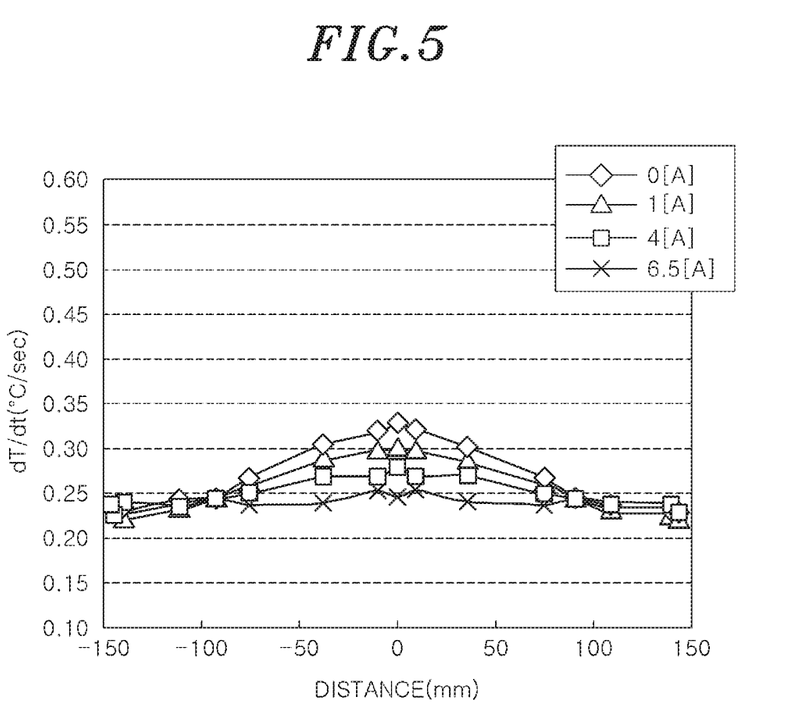
FIG. 5 is a graph showing measurement results of ion flux distribution in the inner space of the plasma processing apparatus shown in FIG. 1.

Hereinafter, FIG. 5 will be referred to. FIG. 5 is a graph showing a measurement result of ion flux distribution in the inner space of the plasma processing apparatus shown in FIG. 1. In a test for obtaining the measurement result shown in FIG. 5, plasma was generated in the inner space 12s in a state where a disc-shaped sample was mounted on the stage 14, and a magnetic field was generated in the inner space 12s by the electromagnet 60. Then, an increase rate (dT/dt) per unit time of a temperature of the sample was obtained at a plurality of measurement points on a diameter of the sample. The increase rate (dT/dt) is a parameter that reflects the amount of ion flux. In the test, the ion flux distribution was measured while setting a current supplied to the coil 64 of the electromagnet 60 to 0 [A], 1 [A], 4 [A], and 6.5 [A]. The other conditions of the test are as follows.

(Conditions of the Test)
Pressure in the inner space 12s: 20 mTorr (2.67 Pa)
Gas supplied to the inner space 12s: Ar gas of 1000 sccm
First radio frequency power: 60 MHz, 100 W
Second radio frequency power: 40 MHz, 100 W In FIG. 5, the horizontal axis represents positions of the plurality of measurement points and also represents a distance from the central axis AX. A measurement point specified by a positive distance is positioned on one side of the central axis AX on the diameter, and a measurement point specified by a negative distance is positioned on the other side of the central axis AX on the diameter. In FIG. 5, the vertical axis represents an increase rate (dT/dt). As shown in FIG. 5, when the current supplied to the coil 64 of the electromagnet 60 is 0 [A], the increase rate (dT/dt), i.e., the ion flux, is decreased as the distance from the central axis AX is increased. In other words, when the current supplied to the coil 64 is 0 [A], non-uniform plasma density distribution is generated. By increasing the current supplied to coil 64, the difference in the ion flux at the plurality of measurement points is decreased. In other words, it was confirmed that uniform plasma density distribution can be generated by generating a magnetic field in the inner space 12s by using the electromagnet 60.

Figure 6:
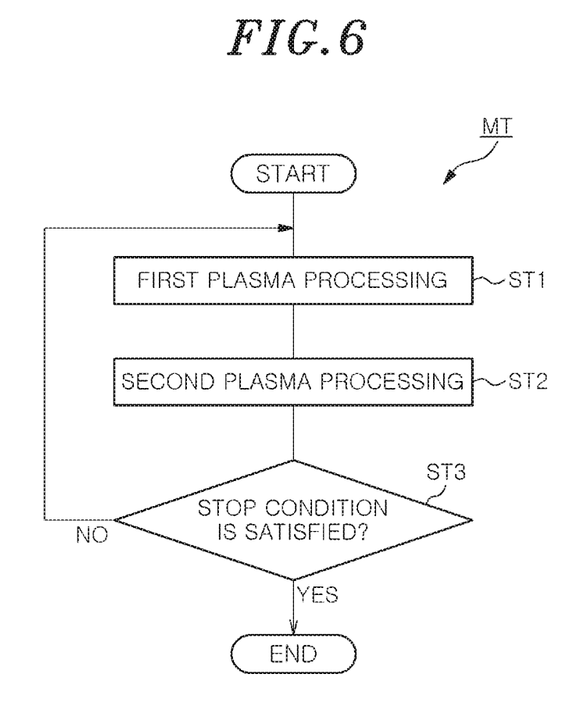
FIG. 6 is a flowchart showing a plasma processing method according to an embodiment.

Hereinafter, a plasma processing method according to an embodiment which can be performed by using the plasma processing apparatus 10 will be described with reference to FIG. 6. FIG. 6 is a flowchart of the plasma processing method according to the embodiment. The plasma processing method (hereinafter, referred to as "method MT") shown in FIG. 6 is performed in a state where a target object W is accommodated in the inner space 12s of the chamber main body 12. The method MT includes steps ST1 and ST2.

In a step ST1, first plasma processing is performed on the target object W. In the step ST1, the target object W is processed by the plasma of the first gas supplied to the inner space 12s. In the step ST1, the second radio frequency power may be or may not be supplied to the lower electrode 18. When the second radio frequency power is supplied to the lower electrode 18 in the step ST1, the second radio frequency power set in the step ST1 is smaller than the second radio frequency power supplied to the lower electrode 18 in the step ST2.

In the step ST2, second plasma processing is performed on the target object W. In the step ST2, the target object W is processed by the plasma of the second gas supplied to the inner space 12s. In the step ST2, the second radio frequency power is supplied to the lower electrode 18. In the step ST2, the second radio frequency power is set to be greater than the second radio frequency power in the step ST1. In one embodiment, the frequency of the second radio frequency power is greater than 13.56 MHz. The frequency of the second radio frequency power may be 40 MHz or more, and may be 60 MHz or more.

In the step ST2, distribution of a magnetic field having a horizontal component, greater than the horizontal component on the center of the target object W, on the edge of the target object W is generated in the inner space 12s by the electromagnet 60.

The steps ST1 and ST2 may be alternately repeated. When the steps ST1 and ST2 are alternately repeated, it is determined whether or not a stop condition is satisfied in a step ST3. The stop condition is determined to be satisfied when the number of executions of a sequence including the steps ST1 and ST2 has reached a predetermined number. When it is determined that the stop condition is not satisfied in step ST3, the step ST1 is executed again and, then, the step ST2 is executed. On the other hand, when it is determined that the stop condition is satisfied in the step ST3, the execution of the method MT is terminated.

In the step ST2 of the method MT, the power of the second radio frequency waves is set to be higher than the second radio frequency power set in the step ST1. Therefore, during the execution of the second plasma processing in the step ST2, the electric field intensity is increased on the center of the target object W and decreased on the edge of the target object W. In other words, during the execution of the second plasma processing, the electric field intensity distribution that is non-uniform in the radial direction with respect to the central axis AX is generated. During the execution of the second plasma processing, the above-described magnetic field distribution is generated in the inner space 12s. In a position where the magnetic field having a large horizontal component is generated, the electron speed is decreased and the electron residence time is increased. As a consequence, the plasma density is increased at the position where the magnetic field having a large horizontal component is generated. Therefore, the plasma density distribution during the execution of the second plasma processing becomes uniform. Since the plasma density distribution becomes uniform by the magnetic field distribution generated by the electromagnet 60, the plasma density distribution can become uniform at a high speed when the first plasma processing is switched to the second plasma processing. In the case of alternately repeating the steps ST1 and ST2, it is particularly effective to use the electromagnet 60 capable of making the plasma density distribution uniform at a high speed.

In one embodiment, the first gas includes a fluorocarbon gas, e.g., $C_4F_8$ gas. The second gas includes a rare gas such as He gas, Ne gas, Ar gas, Kr gas, Xe gas, or the like. The method MT of the present embodiment can selectively etch a first region made of silicon oxide with respect to a second region made of silicon nitride.

Figure 7:
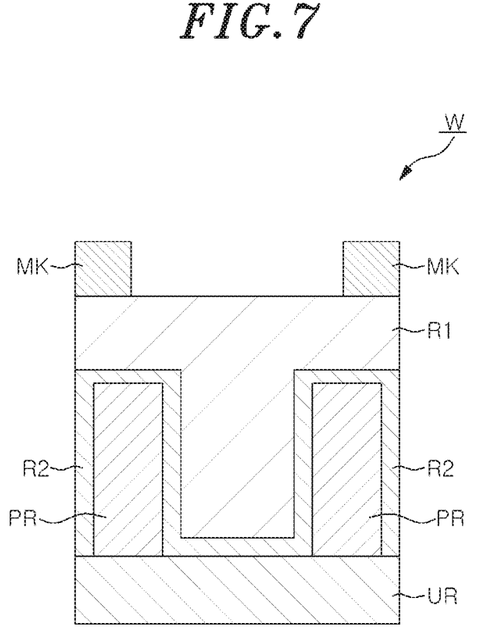
FIG. 7 is a partially enlarged cross sectional view showing an example of the target object to which the method shown in FIG. 6 can be applied.

FIG. 7 is a partially enlarged cross sectional view of an example of a target object to which one embodiment of the method shown in FIG. 6 can be applied. The target object W shown in FIG. 7 has an underlying region UR, a plurality of protruding regions PR, a first region R1, a second region R2, and a mask MK. This target object W may be, e.g., a product that can be obtained during a process of manufacturing a fin field effect transistor.

The underlying region UR may be made of, e.g., polycrystalline silicon. In one example, the underlying region UR is a fin region and has a substantially rectangular parallelepiped shape. The protruding regions PR are provided on the underlying region UR and arranged substantially in parallel to each other. The protruding regions PR may be, e.g., gate regions. The second region R2 is made of silicon nitride. The second region R2 is provided to cover the protruding regions PR and the underlying region UR. The second region R2 provides a recess between two adjacent protruding regions PR. The first region R1 is made of silicon oxide. The first region R1 is disposed in the recess provided by the second region R2. The first region R1 is provided to cover the second region R2. The mask MK is provided on the first region R1. The mask MK is patterned to provide an opening above the recess provided by the second region R2. A width of the opening of the mask MK is greater than that of the recess provided by the second region R2. The mask MK is made of an organic film. The mask MK can be formed by a photolithography technique.

Figure 8:
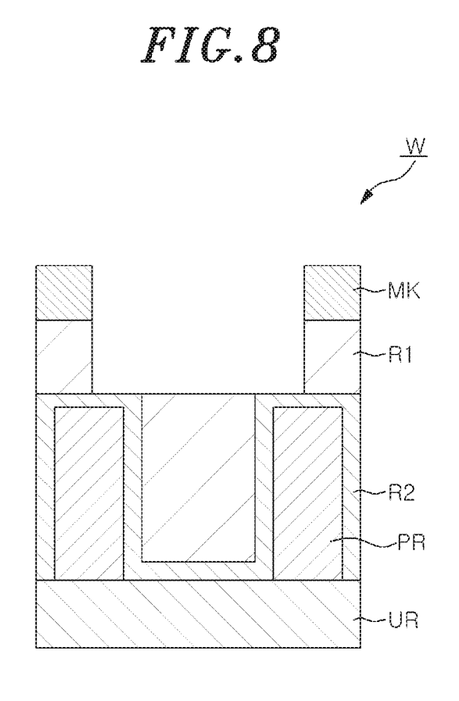
FIG. 8 is a partially enlarged cross sectional view showing the target object processed from a state shown in FIG. 7.
Figure 9A:
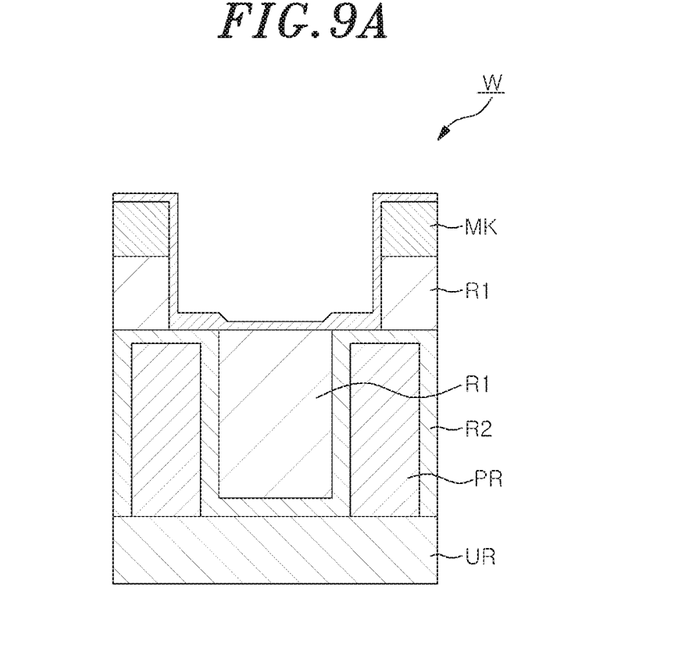
FIG. 9A is a partially enlarged cross sectional view showing the target object after execution of a step ST1 in the method shown in FIG. 6.
Figure 9B:
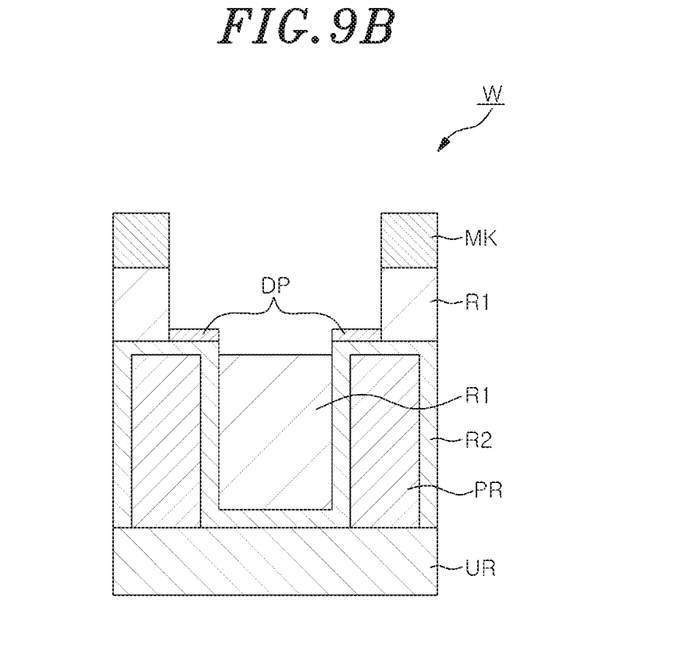
FIG. 9B is a partially enlarged cross sectional view showing the target object after execution of a step ST2 in the method shown in FIG. 6.
Figure 10:
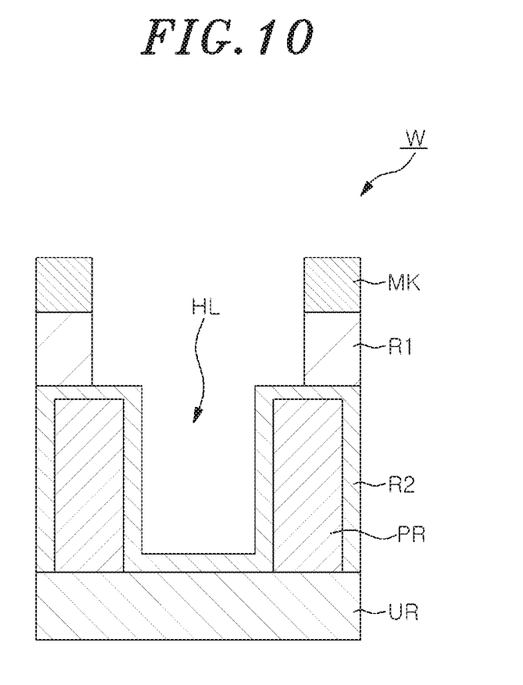
FIG. 10 is a partially enlarged cross sectional view showing the target object to which the method shown in FIG. 6 is applied.

Hereinafter, the method MT according to an embodiment which is applied to the target object W shown in FIG. 7 will be described. The method MT according to an embodiment can also be applied to any target object having a first region made of silicon oxide and a second region made of silicon nitride. Hereinafter, FIGS. 8, 9A, 9B, and 10 will be referred to in addition to FIGS. 6 and 7. FIG. 8 is a partially enlarged cross sectional view of the target object processed from the state shown in FIG. 7. FIG. 9A is a partially enlarged cross sectional view of the target object after the execution of the step ST1 of the method according to the embodiment shown in FIG. 6. FIG. 9B is a partially enlarged cross sectional view of the target object after the execution of the step ST2 of the method according to the embodiment shown in FIG. 6. FIG. 10 is a partially enlarged cross sectional view of the target object to which the method according to the embodiment shown in FIG. 6 is applied.

In the method MT according to the embodiment, the first region R1 may be etched only by the steps ST1 and ST2. Alternatively, before the first execution of the step ST1, the first region R1 may be etched by another plasma etching until the second region R2 is exposed (see FIG. 8) or until the exposure of the second region R2 is started. For example, the first region R1 may be etched by active species such as ions and/or radicals in the plasma of the fluorocarbon gas until the second region R2 is exposed (see FIG. 8) or immediately before the second region R2 is exposed.

In the step ST1 of the method MT of one embodiment, the target object W is processed by the plasma of the first gas containing a fluorocarbon gas. The first gas may contain a rare gas such as oxygen gas, Ar gas or the like, in addition to the fluorocarbon gas. In the step ST1, a film DP of a deposit containing fluorocarbon is formed on the target object W. In the step ST1, the film DP is formed so that a film thickness of the film DP on the second region R2 becomes greater than that of the film DP on the first region R1.

Specifically, in the step ST1, the first gas is supplied to the inner space 12s, and the pressure in the inner space 12s is decreased to a predetermined level by the gas exhaust unit 34. By supplying the first radio frequency power, the first gas is excited in the inner space 12s. Accordingly, plasma of the first gas is generated in the inner space 12s. In the step ST1, the second radio frequency power is set to be lower than the second radio frequency power in the step ST2. In the step ST1, the second radio frequency power may not be supplied to the lower electrode 18.

In the step ST1, the temperature of the target object W is set to be within a range from 20° C. to 250° C. The temperature of the target object W is controlled by the heat exchange medium supplied to the flow path 18p and one or more heaters provided in the electrostatic chuck 20. When the temperature of the target object W is set as described above, the film DP of the deposit containing fluorocarbon is formed on the target object W as shown in FIG. 9A. As shown in FIG. 9A, the film DP is thick on the second region R2 and thin on the first region R1. A temperature higher than 250° C. is a glass transition temperature of the mask MK. At this temperature, a difference between the film thickness of the film DP formed on the first region R1 and that of the film DP formed on the second region R2 is small. Even at a temperature lower than 20° C., the difference between the film thickness of the film DP formed on the first region R1 and that of the film DP formed on the second region R2 is small.

In the step ST2, the target object W processed in the step ST1 is processed by the plasma of the second gas containing a rare gas. The second gas may contain only a rare gas. Alternatively, the second gas may contain oxygen gas in addition to the rare gas. In the step ST2, the second gas is supplied to the inner space 12s, and a pressure in the inner space 12s is decreased to a predetermined level by the gas exhaust unit 34. By supplying the second radio frequency power, the second gas is excited in the inner space 12s. Accordingly, plasma of the second gas is generated in the inner space 12s. In the step ST2, the second radio frequency power is supplied to the lower electrode 18. In the step ST2, the second radio frequency power is set to be higher than the second radio frequency power in the step ST1.

In the step ST2, ions of a rare gas are irradiated to the target object W. When the ions of the rare gas are irradiated to the film DP, the first region R1 is etched by radicals of the fluorocarbon contained in the film DP. Although the film DP on the second region R2 is decreased, the second region R2 is protected from etching. When the step ST2 is executed, the target object W shown in FIG. 9A has a state shown in FIG. 9B. By repeating the steps ST1 and ST2 alternately, the first region R1 in the recess provided by the second region R2 is removed, and the opening HL is formed, as shown in FIG. 10. In other words, the opening HL is formed in a self-aligned manner.

When a width of the recess provided by the second region R2 is small, a deposit is thickly deposited on the first region R1 in the narrow recess by executing the step ST1. When a deposit film is thickly formed on the first region R1, the etching of the first region R1 does not proceed in the step ST2. Therefore, when the width of the recess provided by the second region R2 is small, it is required to decrease the thickness of the deposit film DP formed on the target object W. When the thickness of the deposit film DP is small, it is required to decrease the energy of the ions of the rare gas which are irradiated to the target object W in order to suppress the etching of the second region R2. The energy of the ions is decreased by using the second radio frequency power having a radio frequency. For example, the second radio frequency power having a frequency greater than 13.56 MHz, i.e., a frequency of 40 MHz or higher or a frequency of 60 MHz or higher, is used. In the case of using the second radio frequency power having a radio frequency, the non-uniformity of the electric field intensity distribution generated in the step ST2 becomes more evident. Such non-uniformity is eliminated or suppressed by generating the magnetic field by the electromagnet 60 in the step ST2.

While various embodiments have been described, various modifications can be made without being limited to the above. In the plasma processing apparatus shown in FIG. 1, the electromagnet has one coil. However, the electromagnet may have one or more coils.

While the present disclosure has been shown and described with respect to the embodiments, it will be understood by those skilled in the art that various changes and modifications may be made without departing from the scope of the present disclosure as defined in the following claims.

What is claimed is:

1. A plasma processing apparatus comprising:
    a chamber main body;
    a gas supply unit configured to supply a gas to an inner space provided by the chamber main body;
    a stage configured to provide a mounting region for a target object provided in the inner space, a center of the mounting region being positioned on a central axis of the chamber main body;
    a lower electrode provided in the stage;
    an upper electrode provided above the stage with the inner space interposed therebetween;
    a power feed conductor connected to the upper electrode, the power feed conductor extending upward from the upper electrode;
    a first radio frequency power supply configured to supply first radio frequency waves and electrically connected to the upper electrode through the power feed conductor;
    a second radio frequency power supply configured to supply second radio frequency waves having a frequency lower than a frequency of the first radio frequency waves and electrically connected to the lower electrode;
    an electromagnet provided above the upper electrode and configured to generate distribution of a magnetic field having a horizontal component, greater than a horizontal component on the central axis, at a position far from the central axis in the inner space; and
    a ground conductor grounded and extending above the chamber main body to cover the upper electrode, wherein the ground conductor includes:
    a cylindrical first portion extending upward from the chamber main body;
    a second portion spaced upwardly from the upper electrode, the second portion extending from the first portion toward the central axis to provide a first space on the upper electrode together with the first portion;
    a cylindrical third portion positioned closer to the central axis compared to the first portion, the third portion extending upward from the second portion to provide a second space communicating with the first space,
    wherein the power feed conductor extends upward through the first space and the second space, and the electromagnet is disposed in an external space provided by the ground conductor at the outside of the third portion, the external space being provided on the second portion and above the inner space.

2. The plasma processing apparatus of claim 1, wherein the ground conductor further includes:
    a fourth portion extending above the second portion from the third portion in a radial direction with respect to the central axis;
    a cylindrical fifth portion, farther from the central axis compared to the third portion, extending upward from the fourth portion; and
    a sixth portion extending above the fourth portion from the fifth portion toward the central axis,
    wherein the power feed conductor extends upward through a third space surrounded by the fourth portion, the fifth portion and the sixth portion and communicating with the second space.

3. The plasma processing apparatus of claim 2, further comprising a first pipe extending upward from the upper electrode through the first space and the second space and extending laterally through the third space to the outside of the ground conductor.

4. The plasma processing apparatus of claim 2, wherein the upper electrode constitutes a shower head configured to inject a gas from the gas supply unit to the inner space, and the plasma processing apparatus further comprises:
    a second pipe extending upward from the upper electrode through the first space and the second space and extending laterally through the third space to the outside of the ground conductor and configured to supply the gas from the gas supply unit to the shower head.

5. The plasma processing apparatus of claim 2, further comprising:
    a DC power supply configured to generate a negative DC voltage to be applied to the upper electrode; and
    a wiring configured to connect the DC power supply and the upper electrode,
    wherein the wiring extends upward from the upper electrode through the first space and the second space and extends laterally through the third space to the outside of the ground conductor.

6. The plasma processing apparatus of claim 1, wherein the electromagnet has a coil wound around the central axis.

7. The plasma processing apparatus of claim 6, wherein an average value of an inner diameter and an outer diameter of the coil is equal to or greater than a distance between the central axis and an edge of the target object.

8. The plasma processing apparatus of claim 1, wherein a frequency of the second radio frequency waves is greater than 13.56 MHz.

9. The plasma processing apparatus of claim 8, wherein the frequency of the second high frequency waves is greater than or equal to 40 MHz.

10. The plasma processing apparatus of claim 8, wherein the frequency of the second high frequency waves is greater than or equal to 60 MHz.

\* \* \* \* \*

UNITED STATES PATENT AND TRADEMARK OFFICE
CERTIFICATE OF CORRECTION

PATENT NO. : 10,763,087 B2
APPLICATION NO. : 16/140948
DATED : September 1, 2020
INVENTOR(S) : Shuichi Takahashi et al.

It is certified that error appears in the above-identified patent and that said Letters Patent is hereby corrected as shown below:

On the Title Page

Item (57) In the Abstract:
Line 10, "space. the third" should be -- space, the third --.

Signed and Sealed this
Eighth Day of December, 2020

Andrei Iancu
*Director of the United States Patent and Trademark Office*